(12) United States Patent
Anderson

(10) Patent No.: US 6,766,497 B2
(45) Date of Patent: Jul. 20, 2004

(54) METHOD AND SYSTEM FOR REPRODUCTION IN A GENETIC OPTIMIZATION PROCESS

(75) Inventor: David M. Anderson, Loveland, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 278 days.

(21) Appl. No.: 10/057,245

(22) Filed: Jan. 25, 2002

(65) Prior Publication Data

US 2003/0145289 A1 Jul. 31, 2003

(51) Int. Cl.[7] .......................... G06F 17/50; G01N 33/48; G06E 1/00
(52) U.S. Cl. ................... 716/2; 716/4; 716/5; 702/21; 706/20
(58) Field of Search ....................... 716/1–21

(56) References Cited

U.S. PATENT DOCUMENTS 5,930,780 A * 7/1999 Hughes et al. ............... 706/13
6,181,945 B1 * 1/2001 Lee .......................... 340/7.21
6,363,368 B2 * 3/2002 Shinagawa ................... 706/13
2002/0010692 A1 * 1/2002 Sasagawa et al. ............ 706/21
2002/0095393 A1 * 7/2002 McHaney .................... 706/13
2002/0169563 A1 * 11/2002 de Carvalho Ferreira ..... 702/20

OTHER PUBLICATIONS

Li et al., "Nonlinear mixed integer programming problems using genetic algorithm and penalty function" Systems, Man, and Cybernetics, 1996., IEEE International Conference on, vol.: 4, Oct. 14–17, 1996 pp. 2677–2682 vol. 4.*

Lin et al., "Genetic algorithm for optimal distribution system planning" Power System Technology, 1998. Proceedings. POWERCON '98. 1998 International Conference on, vol.: 1, Aug. 18–21, 1998 pp. 241–245 vol. 1.*

Pham et al., "Genetic algorithm using gradient-like reproduction operator" Electronics Letters, vol.: 31 Issue:18, Aug. 31, 1995 pp. 1558–1559.*

Alexander Schatten, Genetic Algorithms Short Tutorial, Jul. 8, 2001, pp. 1–12, http://www.ifs.tuwien.ac.at/aschatt/info/ga/genetic.html.

* cited by examiner

Primary Examiner—Matthew Smith
Assistant Examiner—Andrea Liu
(74) Attorney, Agent, or Firm—Thomas M. Croft

(57) ABSTRACT

A reproduction method and system supports rapid convergence of a genetic optimization process. Mating, mutation, or both may be combined with biased parent selection during each mating season.

9 Claims, 10 Drawing Sheets

US 6,766,497 B2

METHOD AND SYSTEM FOR REPRODUCTION IN A GENETIC OPTIMIZATION PROCESS

FIELD OF THE INVENTION

The present invention relates generally to computerized optimization techniques and more specifically to techniques based on a genetic model.

BACKGROUND OF THE INVENTION

Due to the large number of variables involved, some optimization problems have an exceedingly large solution space. For example, selecting design parameters such as size and threshold voltage for each of thousands of instances (i.e., gates) in an integrated circuit to minimize power consumption while maintaining acceptable timing performance is such a problem.

One approach to solving complex optimization problems is genetic optimization, an iterative, computer-implemented technique in which candidate solutions are generated using a genetic model. The genetic model typically includes a set of N randomly generated chromosomes, each chromosome comprising a number of genes. Since each gene represents a particular state of a parameter to be optimized in one part of a system (e.g., the size of one instance in an integrated circuit), each chromosome represents a possible solution to the global optimization problem. In a typical application, the configuration specified by each chromosome is evaluated, and a figure of merit or "score" is assigned to each chromosome. For example, in the case of an integrated circuit design, a circuit having the characteristics of each chromosome may be simulated to assign a score indicating the desirability of its power consumption and timing performance. Once each chromosome has been assigned a score, the N chromosomes may be "mated" or "mutated" in various ways to create other potential solutions or "children," which may, in turn, be evaluated and assigned a score. If a child has a higher score than one of the original N chromosomes, the chromosome with the lowest score may be discarded. Eventually, the candidate solutions generated in this fashion may converge to the global optimum.

A key aspect of such a genetic algorithm is reproduction, the method by which new solutions are generated during each "mating season." In one well-known approach, pairs of chromosomes or "mating combinations" are formed, and mating combinations are randomly selected for possible mating. If the composite score of a mating combination is higher than a predetermined threshold, the chromosomes are mated. Otherwise, they are not mated. However, this approach can lead to too many or too few children being produced during each mating season, if the threshold is set too high or too low. The consequence in either case is slower convergence.

It is thus apparent that there is a need in the art for an improved method and system for reproduction in a genetic optimization process.

SUMMARY OF THE INVENTION

A method is provided for reproduction in a computer-implemented optimization process based on a genetic model. Both a system and a computer-readable storage medium containing program instructions are provided for carrying out the method.

Other aspects and advantages of the present invention will become apparent from the following detailed description, taken in conjunction with the accompanying drawings, illustrating by way of example the principles of the invention.

DETAILED DESCRIPTION OF THE INVENTION

Figure 1A:
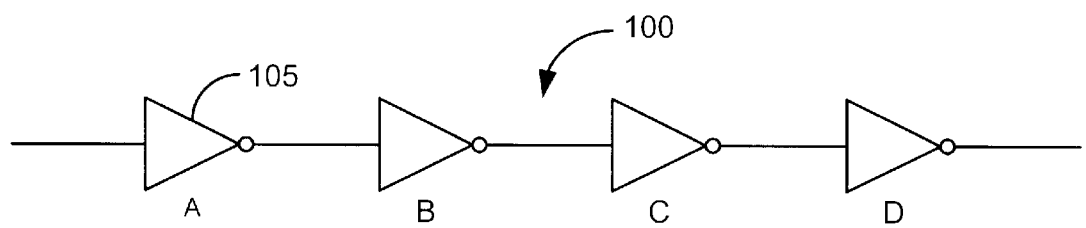
FIGS. 1A–1C are illustrations showing how instances in an integrated circuit may be mapped onto a genetic algorithm in accordance with an illustrative embodiment of the invention.
Figure 1B:
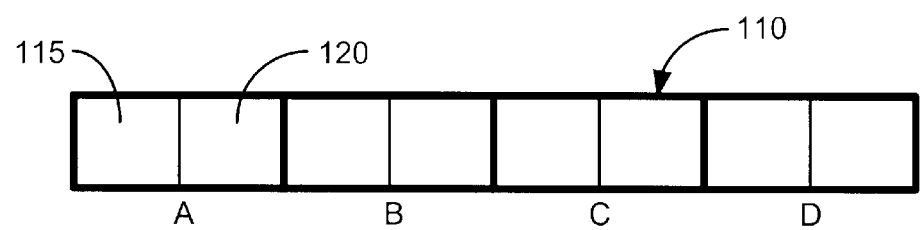
Figure 1C:
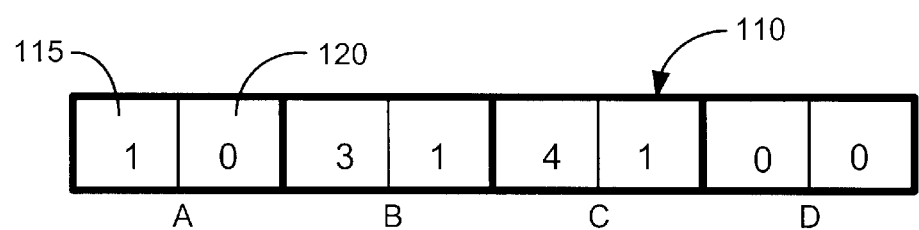

FIGS. 1A–1C illustrate how instances in an integrated circuit may be mapped onto a genetic algorithm in accordance with an illustrative embodiment of the invention. FIG. 1A is a gate-level diagram of a simple integrated circuit 100. In this simplified example, integrated circuit 100 comprises four instances 105, each of which is an inverter. Each instance 105 is labeled A-C to facilitate further description. FIG. 1B is a conceptual diagram of a chromosome 110 comprising a size gene 115 and a threshold voltage ($V_t$) gene 120 for each instance 105 for a total of eight genes. Genes 115 and 120 may be represented conveniently as integers. For example, size gene 115 may comprise an integer between 0 and 5, inclusive, corresponding to predetermined physical sizes of the associated instance 105. Likewise, threshold voltage gene 120 may comprise an integer equal to either zero (low $V_t$) or one (high $V_t$). An example of a particular chromosome conforming to the foregoing scheme is shown in FIG. 1C.

Figure 2:
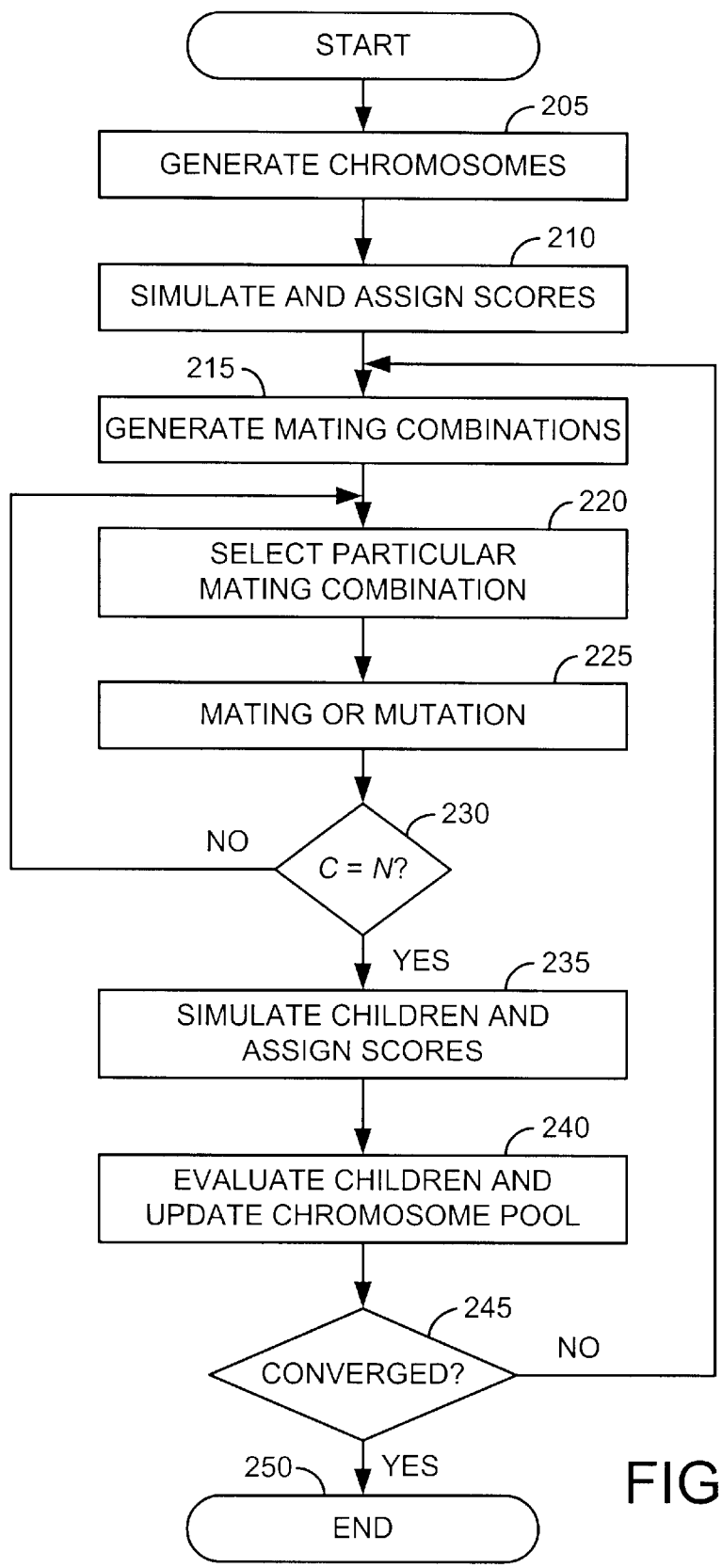
FIG. 2 is a flowchart of a genetic optimization process in accordance with an illustrative embodiment of the invention.

FIG. 2 is a flowchart of a genetic optimization process in accordance with an illustrative embodiment of the invention. At 205, a set of N unique chromosomes may be generated. For example, a random number generator may be used to assign a value to each gene 115 or 120 in each of the N chromosomes. The set of N chromosomes will also be referred to as a "chromosome pool" in this description. In practice, the values generated by the random number generator may be pseudorandom. The performance of a simulated integrated circuit 100 having the design characteristics specified by each of the N chromosomes may be simulated at 210. In this illustrative embodiment, the power consumption of integrated circuit 100 is to be minimized while maintaining acceptable timing. At 210, a score may be assigned to each chromosome indicating how well it meets the design goals. For example, the score may be a number proportional to the total power consumption of the integrated circuit 100. At 215, a set of mating combinations, each comprising a first and a second chromosome, may be generated from the N chromosomes comprising the chromosome pool. For example, if all possible mating combinations are generated for N=10, a total of M=45 mating combinations results. At 220, a particular mating combination for subsequent reproduction may be chosen from among the M mating combinations. The particular mating combination selected will also be called a "set of parents" for the purposes of this description. Parent selections will be explained more fully in a later portion of this description. A set of parents (mating) or a copy of a single parent (mutation) may be used at 225 to generate a child chromosome. Mating and mutation methods will be explained more fully in a later portion of this detailed description. At 230, if the desired number of children has been generated, control may proceed to 235. Otherwise, steps 220 and 225 may be repeated until the desired number of children has been produced. For example, N children may be produced during each mating season (one pass through the loop comprising steps 215 through 245). However, more or fewer children may be produced during each mating season in other embodiments. At 235, each resulting child chromosome may be simulated to determine its corresponding performance score. One advantageous technique is to send each child chromosome to a different dedicated processing node in parallel fashion. The best N chromosomes from among the original N and the child chromosomes may be retained for the next mating season at 240. If the N chromosomes have converged to within a predetermined tolerance at 245, the process may be terminated at 250. Otherwise, control may return to 215, and a new mating season may begin based upon the updated chromosome pool.

Figure 3:
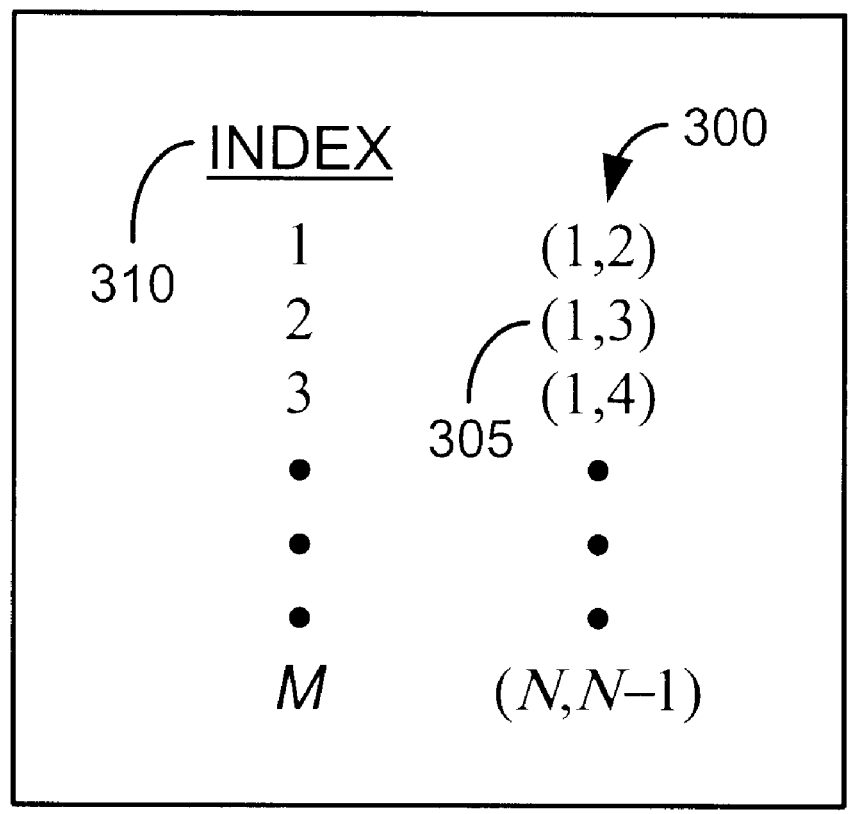
FIG. 3 is an illustration of a set of mating combinations in accordance with an illustrative embodiment of the invention.

FIG. 3 illustrates a set of mating combinations 300 in accordance with an illustrative embodiment of the invention. Each mating combination 305 is shown in FIG. 3 as an ordered pair of the N chromosomes in the chromosome pool. Each mating combination 305 may be assigned an index 310 from 1 to M. A composite performance score (not shown in FIG. 3) may also be assigned to each mating combination 305. One simple way to compute such a composite score is to compute the product of the score associated with each individual chromosome comprising the mating combination 305. Mating combinations 300 may also be sorted or mapped to appropriate indices 310 in order of decreasing or increasing composite score. In this particular illustrative embodiment, mating combinations 300 are sorted from best to worst composite score, as indicated in FIG. 3.

Figure 4:
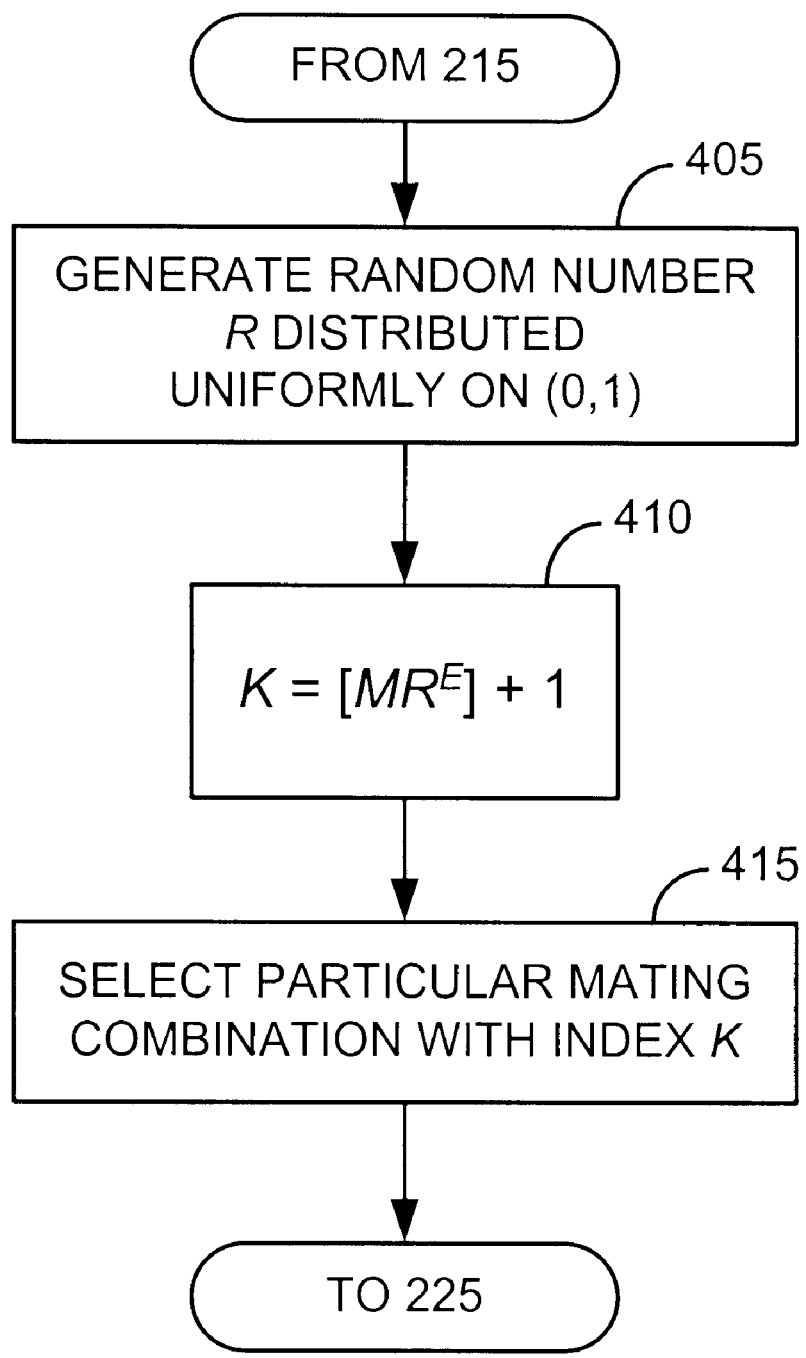
FIG. 4 is a flowchart of a method for selecting a particular mating combination in accordance with an illustrative embodiment of the invention.

FIG. 4 is a flowchart of a method for selecting a particular mating combination or set of parents in accordance with an illustrative embodiment of the invention. After 215, a random number generator may be used at 405 to produce a real number R distributed uniformly on the open interval (0,1). At 410, R may be raised to a power $E$, where $E$ is a real number greater than unity, and multiplied by M, the number of mating combinations. The greatest integer less than or equal to this product may be computed, and one may be added to generate an integer index K between 1 and M, inclusive. The particular mating combination 305 having an index equal to K may be selected as a set of parents at 415. The index K as computed in FIG. 4 biases the selection of sets of parents in favor of those mating combinations 305 having a favorable composite score. The exponent E, being greater than unity, drives the fraction R closer to zero, resulting in a lower index K than would result from a uniformly distributed random index based on R alone. This approach also guarantees that a child will be generated on each attempt, unlike the prior-art threshold method. The exponent E may also be selected and adjusted by a user to provide precise control over the degree of bias. Once a set of parents has been selected, a child chromosome may be produced by either mating the first parent with the second parent or by mutating a copy of a single parent (225).

Figure 5:
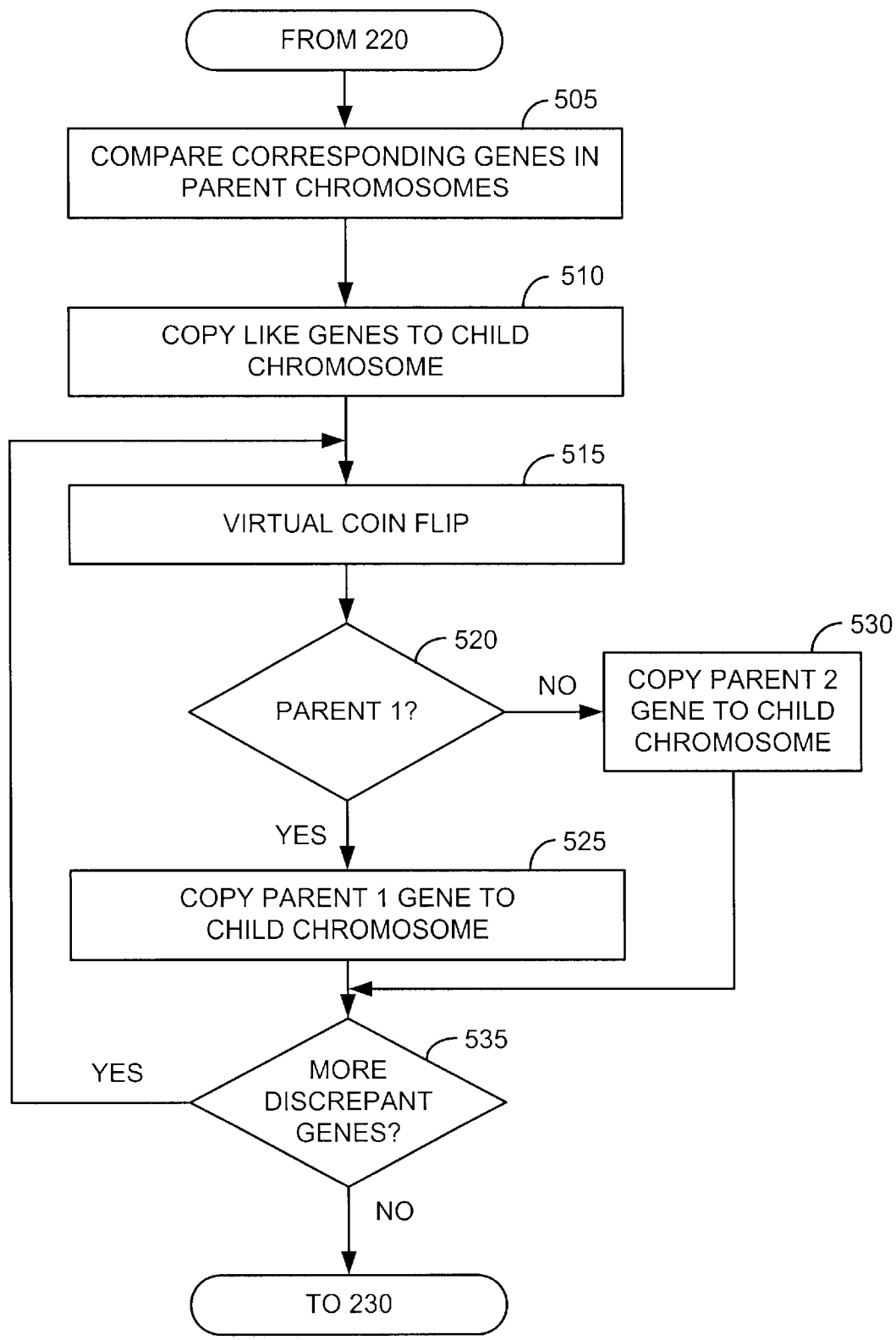
FIG. 5 is a flowchart of a mating method in accordance with an illustrative embodiment of the invention.

FIG. 5 is a flowchart of a mating method in accordance with an illustrative embodiment of the invention. Following 220, corresponding genes of the first and second parents may be compared at 505 to determine which are alike and which are different. Those genes that are the same in both parents may be copied to a child chromosome at 510. To assign a value for discrepant genes to the genes of the child chromosome, the loop beginning at 515 may be performed. At 515, a "virtual coin flip" may be conducted using a random number generator. The virtual coin flip may be fair or biased, depending on the embodiment. If the first parent wins the toss at 520, the value of the gene belonging to the first parent is copied to the corresponding gene of the child chromosome at 525. Otherwise, the value of the gene belonging to the second parent is copied to the corresponding gene of the child chromosome at 530. The virtual coin flip at 515 simulates the characteristic of dominance in genetics, and a discrepant gene so assigned to the child chromosome will be referred to in this description as a "dominant gene." If all discrepant genes have been resolved, control may proceed to 230. Otherwise, control may return to 515 for the assignment of another discrepant gene.

Figure 6:
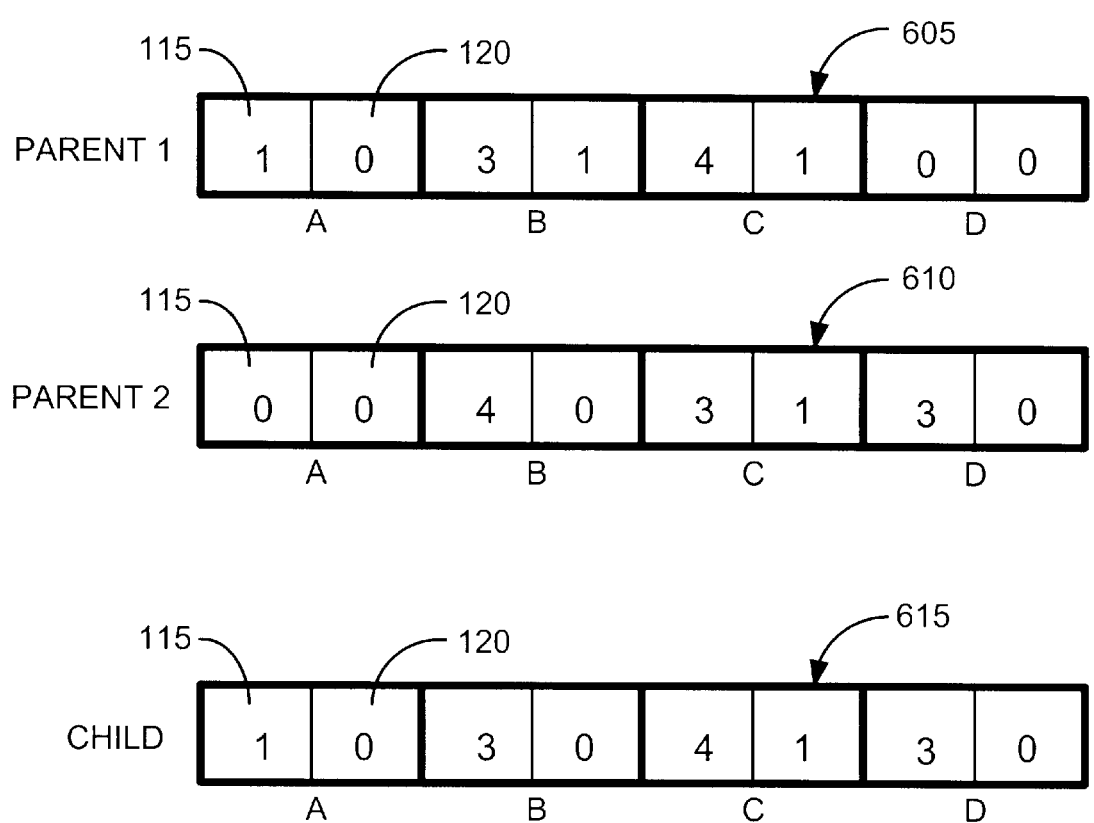
FIG. 6 is an illustration of the operation of the mating method shown in FIG. 5.

FIG. 6 illustrates the operation of the mating method shown in FIG. 5. First parent ("Parent 1") 605 and second parent ("Parent 2") 610 are mated to produce child 615. Each corresponding gene having the same value in both parents is copied to child 615. Here, the threshold voltage gene 120 of A, the threshold voltage gene 120 of C, and the threshold voltage gene 120 of D are copied to child chromosome 615. The discrepant genes are copied randomly from either the first or the second parent, as explained in connection with FIG. 5. Here, size gene 115 of A is assigned the value of the first parent, size gene 115 of B is assigned the value of the first parent, threshold voltage gene 120 of B is assigned the value of the second parent, size gene 115 of C is assigned the value of the first parent, and size gene 115 of D is assigned the value of the second parent.

Figure 7:
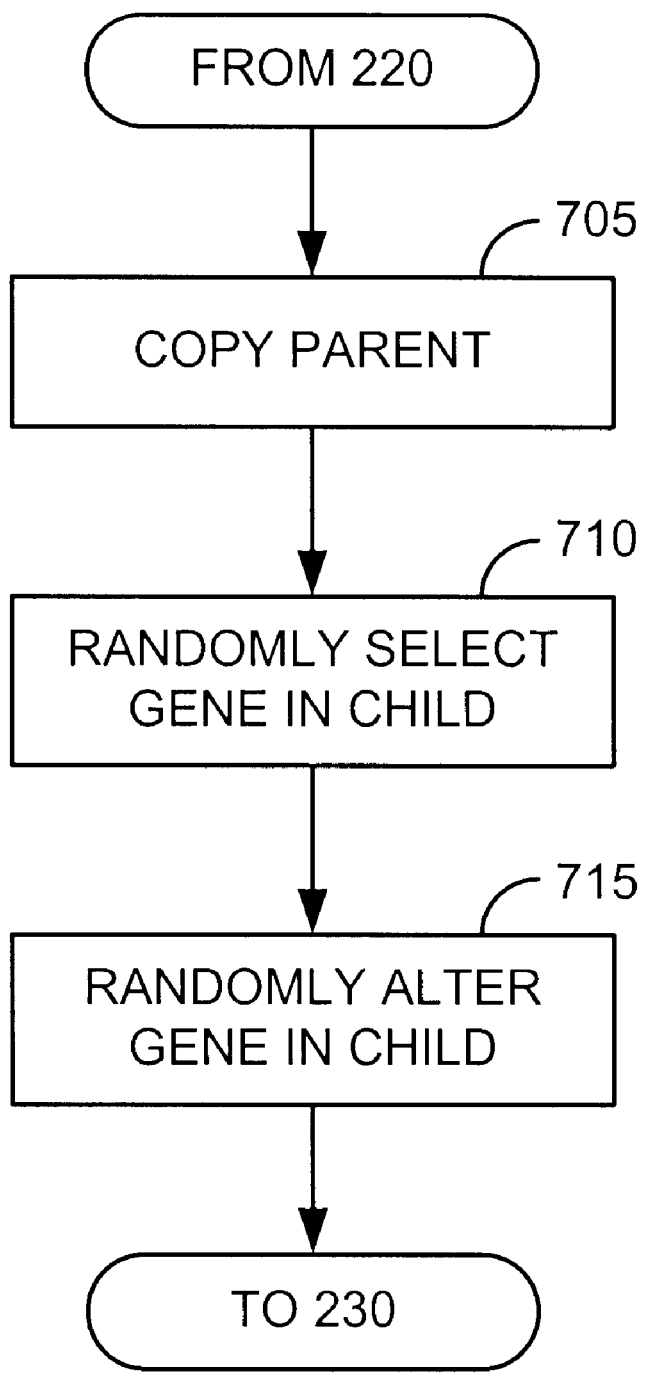
FIG. 7 is a flowchart of a mutation method in accordance with an illustrative embodiment of the invention.

FIG. 7 is a flowchart of a mutation method in accordance with an exemplary embodiment of the invention. After 220, a copy or "clone" of one of the two parents may be made at 705. Although either parent may be chosen, the first parent will be selected arbitrarily for the purposes of this description. At 710, one or more genes may be selected in the child chromosome for subsequent mutation. In the particular embodiment shown in FIG. 7, one gene is chosen at random. The randomly selected gene is altered randomly at 715, comprising the mutation. Control may then proceed to 230. In some cases, mutation may produce a child that is closer to the desired solution than mating. As will be explained later in this description, a combination of mating and mutation has been found to be synergistic, especially when combined with a biased parent selection technique such as that shown in FIG. 4.

Figure 8:
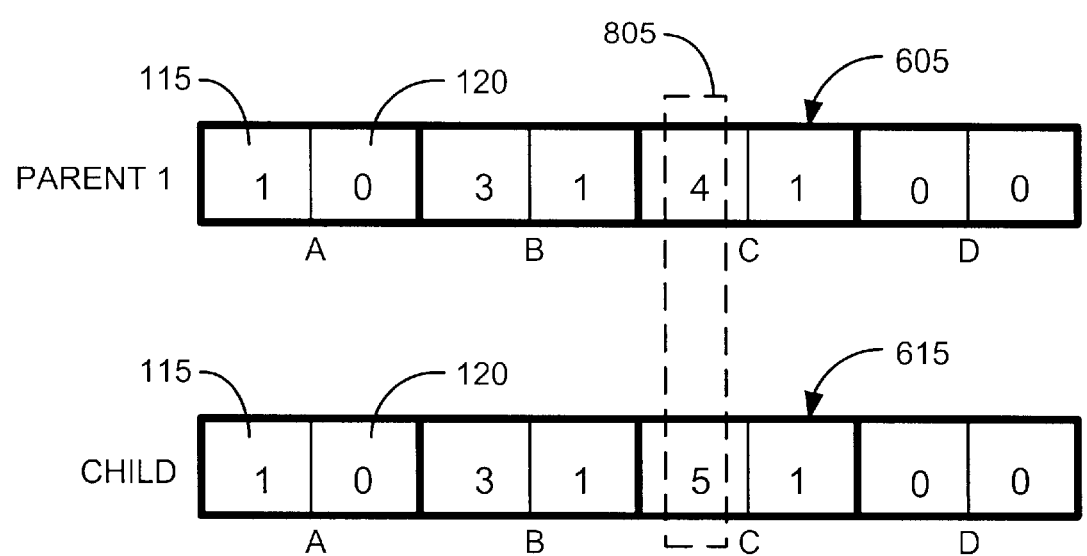
FIG. 8 is an illustration of the operation of the mutation method shown in FIG. 7.

FIG. 8 illustrates the operation of the mutation method shown in FIG. 7. In FIG. 8, first parent 605 has been copied or cloned to produce child 615. Subsequently, size gene 115 of C indicated by the dotted bounding box has been randomly altered within the allowed range, resulting in a change from "4" to "5."

Figure 9:
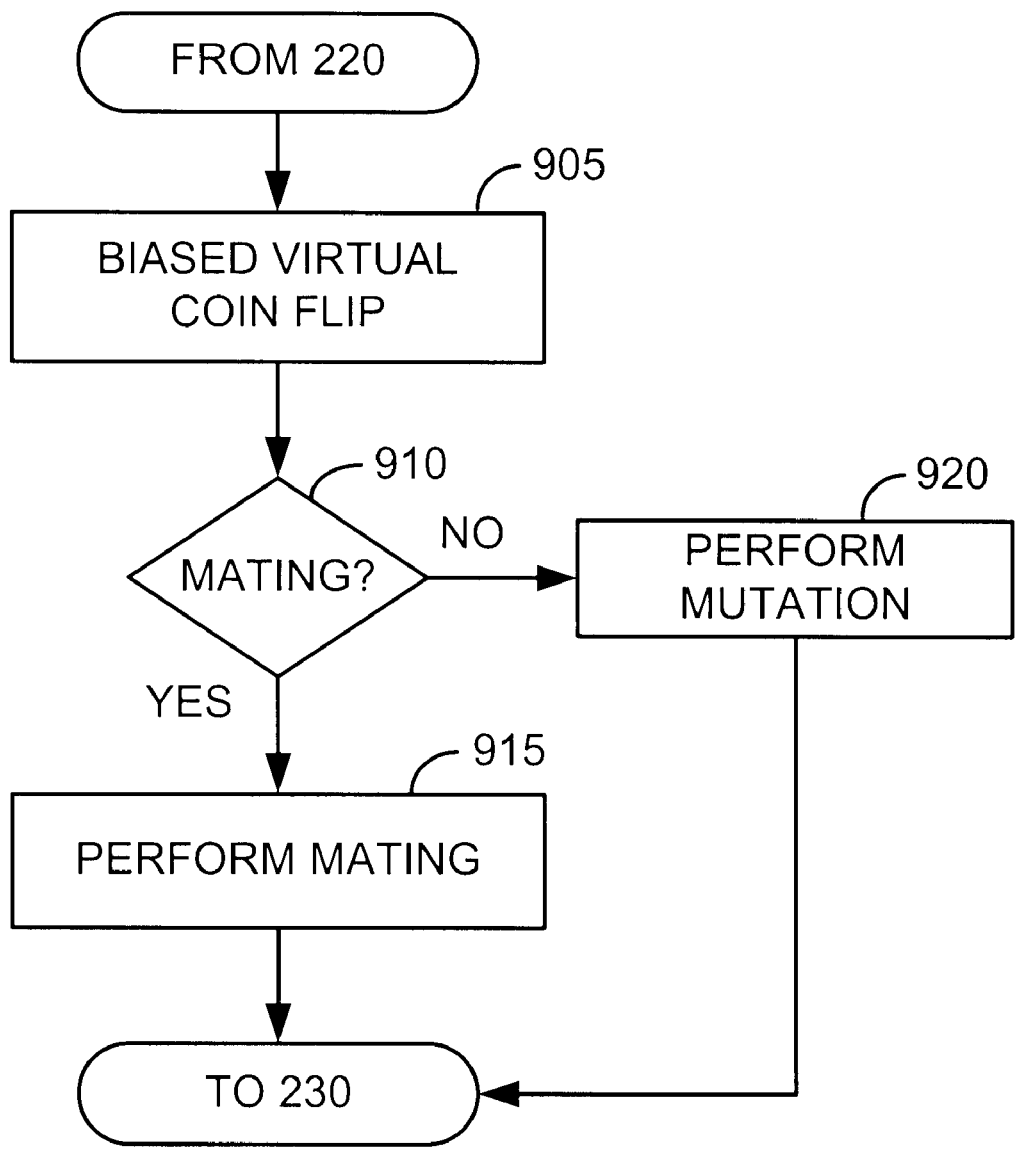
FIG. 9 is a flowchart of a method for combining mating and mutation in accordance with an illustrative embodiment of the invention.

FIG. 9 is a flowchart of a method for combining mating and mutation in accordance with an exemplary embodiment of the invention. After 220, a biased virtual coin flip may be performed at 905 to select between mating and mutation. For example, the biased virtual coin clip may select mutation for 80 percent of the children produced and mating for the remaining 20 percent. If the result at 910 is that mating is to be performed, a mating method such as that described in connection with FIG. 5 may be executed at 915. Otherwise, a mutation method such as that described in connection with FIG. 7 may be performed at 920. Once a child has been produced by either method, control may proceed to 230. As mentioned above, combining a biased parent selecting method such as that shown in FIG. 4 with both mating and mutation has been found to produce synergistic results. Such an approach can provide significantly more rapid convergence than conventional genetic optimization techniques.

Figure 10:
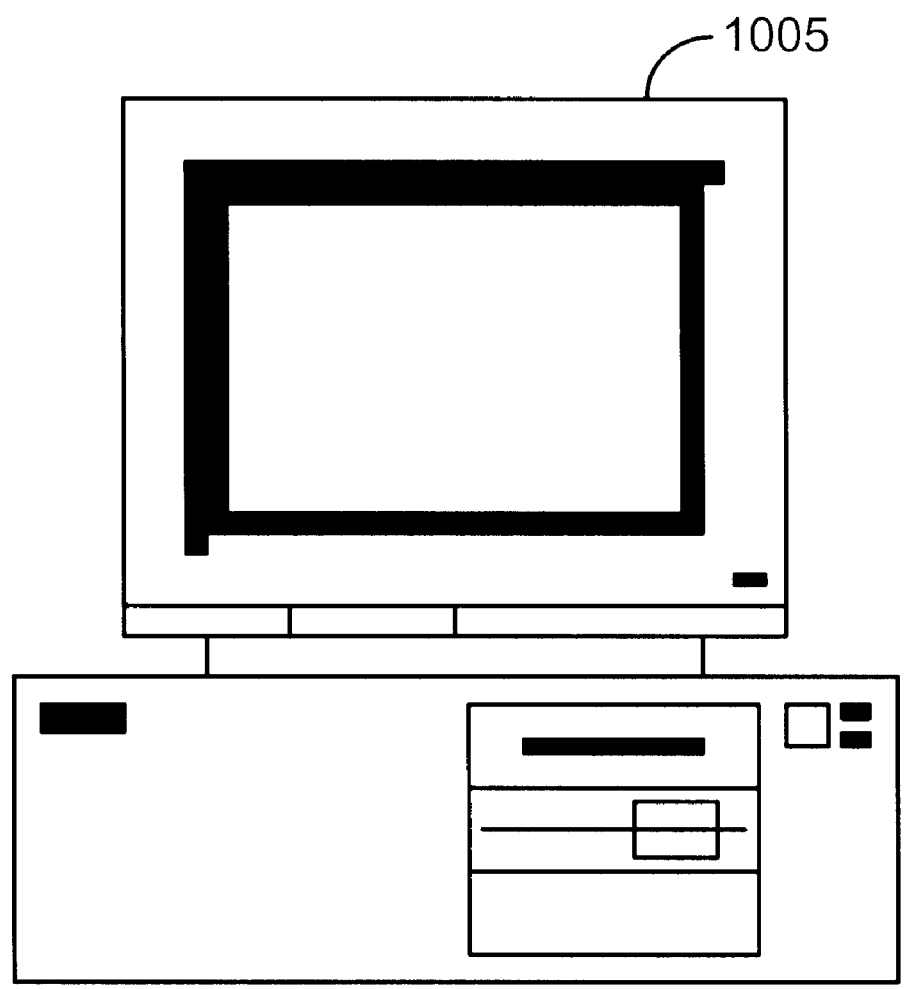
FIG. 10 is an illustration of a system for carrying out the methods of the invention in accordance with an illustrative embodiment of the invention.

FIG. 10 illustrates a system for carrying out the methods of the invention, in accordance with an illustrative embodiment of the invention. FIG. 10 depicts a general purpose computer 1005. The methods of the invention may be programmed to execute on such a general purpose computer 1005 or, alternatively, the invention may be implemented in a special-purpose (e.g., high-performance) computer, in custom hardware, or in any combination of hardware and software. Program code implementing the invention may also be stored on a computer-readable storage medium. Examples of computer-readable storage media include solid-state read-only memory, magnetic disks, and optical disks.

The foregoing description of the present invention has been presented for the purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for reproduction as part of a computer-implemented optimization process based on a genetic model, comprising the steps of:

generating a set of mating combinations, each mating combination comprising a first chromosome and a second chromosome selected from a set of chromosomes, each chromosome comprising at least one gene;

assigning a composite score to each mating combination;

selecting a particular mating combination using a biased random value, the biased random value favoring mating combinations having a favorable composite score, the first and second chromosomes of the particular mating combination comprising first and second parents, respectively;

comparing the genes of the first parent with the corresponding genes of the second parent;

copying to corresponding genes of a child chromosome at least one gene that is common to both the first and second parents; and copying to corresponding genes of the child chromosome at least one dominant gene that is different in the first and second parents.

2. The method of claim 1, wherein each dominant gene is randomly selected from one of the parents.

3. A method for reproduction as part of a computer-implemented optimization process based on a genetic model, comprising the steps of:

generating a set of mating combinations, each mating combination comprising a first chromosome and a second chromosome selected from a set of chromosomese, each chromosome comprising at least one gene;

assigning a composite score to each mating combination;

sorting the mating combinations from most favorable to least favorable according to their associated composite scores, each sorted mating combination having an associated index;

generating a random value distributed uniformly between zero and one:

raising the random value to a predetermined power greater than one to produce a biased random value;

multiplying the number of mating combinations by the biased random value to compute a selection index;

selecting the first and second chromosomes of the mating combination whose index corresponds to the selection index as first and second parents, respectively;

comparing the genes of the first parent with the corresponding genes of the second parent;

copying to corresponding genes of a child chromosome at least one gene that is common to both the first and second parents; and copying to corresponding genes of the child chromosome at least one dominant gene that is different in the first and second parents.

4. The method of claim 3, wherein each dominant gene is randomly selected from one of the parents.

5. A method for reproduction as part of a computer-implemented process based on a genetic model for optimizing the power consumption and timing of an integrated circuit comprising a plurality of instances, the method comprising:

providing a set of chromosomes, each chromosome comprising a plurality of genes representing a set of design choices for the instances in the integrated circuit, each instance being mapped to a first gene representing the size of that instance and a second gene representing the threshold voltage of that instance;

simulating for each chromosome the power consumption and timing performance of an integrated circuit corresponding to the set of design choices specified by the genes in that chromosome;

assigning a score to each chromosome according to its simulated power consumption and timing performance;

generating a set of mating combinations, each mating combination comprising a first chromosome and a second chromosome selected from the set of chromosomes;

assigning a composite score to each mating combination, the composite score comprising the product of the score associated with the first chromosome and the score associated with the second chromosome;

sorting the mating combinations from most favorable to least favorable according to their associated composite scores, each sorted mating combination having an associated index;

generating a random value distributed uniformly between zero and one;

raising the random value to a predetermined power greater than one to produce a biased random value;

multiplying the number of mating combinations by the biased random value to compute a selection index;

selecting the first and second chromosomes of the mating combination whose index corresponds to the selection index as first and second parents, respectively;

comparing the genes of the first parent with the corresponding genes of the second parent;

copying to corresponding genes of a child chromosome at least one gene that is common to both the first and second parents; and copying to corresponding genes of the child chromosome at least one dominant gene that is different in the first and second parents.

6. The method of claim 5, wherein each dominant gene is randomly selected from one of the parents.

7. A system programmed to perform the following method:

providing a set of chromosomes, each chromosome comprising at least one gene;

generating a set of mating combinations, each mating combination comprising a first chromosome and a second chromosome selected from the set of chromosomes;

assigning a composite score to each mating combination; and selecting a particular mating combination using a biased random value, the biased random value favoring mating combinations having a favorable composite score, the first and second chromosomes of the particular mating combination comprising first and second parents, respectively;

comparing the genes of the first parent with the corresponding genes of the second parent;

copying to corresponding genes of a child chromosome at least one gene that is common to both the first and second parents; and copying to corresponding genes of the child chromosome at least one dominant gene that is different in the first and second parents.

8. A system for performing reproduction as part of a computer-implemented optimization process based on a genetic model, comprising:

means for providing a set of chromosomes, each chromosome comprising at least one gene;

means for generating a set of mating combinations, each mating combination comprising a first chromosome and a second chromosome selected from the set of chromosomes;

means for assigning a composite score to each mating combination;

means for selecting randomly a particular mating combination such that mating combinations having a favorable composite score are favored, the first and second chromosomes of the particular mating combination comprising first and second parents, respectively;

means for comparing the genes of the first parent with the corresponding genes of the second parent;

means for copying to corresponding genes of a child chromosome at least one gene that is common to both the first and second parents; and means for copying to corresponding genes of the child chromosome at least one dominant gene that is different in the first and second parents.

9. A computer-readable storage medium containing program code to perform reproduction as part of an optimization process based on a genetic model, the computer-readable storage medium comprising:

a first code segment configured to generate a set of mating combinations, each mating combination comprising a first chromosome and a second chromosome selected from a set of chromosomes, each chromosome comprising at least one gene;

a second code segment configured to assign a composite score to each mating combination; and a third code segment configured to select a particular mating combination using a biased random value, the biased random value favoring mating combinations having a favorable composite score, the first and second chromosomes of the particular mating combination comprising first and second parents, respectively;

a fourth code segment configured to compare the genes of the first parent with the corresponding genes of the second parent;

a fifth code segment configured to copy to corresponding genes of a child chromosome at least one gene that is common to both the first and second parents; and a sixth code segment configured to copy to corresponding genes of the child chromosome at least one dominant gene that is different in the first and second parents.

* * * * *